(12) United States Patent
Chua et al.

(10) Patent No.: US 7,888,217 B2
(45) Date of Patent: Feb. 15, 2011

(54) METHOD FOR FABRICATING A GATE DIELECTRIC OF A FIELD EFFECT TRANSISTOR

(75) Inventors: Thai Cheng Chua, Cupertino, CA (US); Cory Czarnik, Saratoga, CA (US); Christopher Sean Olsen, Fremont, CA (US); Khaled Z. Ahmed, Anaheim, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1421 days.

(21) Appl. No.: 11/255,857

(22) Filed: Oct. 20, 2005

(65) Prior Publication Data

US 2007/0093012 A1  Apr. 26, 2007

(51) Int. Cl.
*H01L 21/336* (2006.01)
(52) U.S. Cl. .............. 438/287; 438/591; 438/772; 438/775; 438/908; 257/E21.67; 257/E21.639
(58) Field of Classification Search .......... 438/216, 438/261, 287, 591, 907–908, 954, 772, 775, 438/785; 257/E21.67, E21.639
See application file for complete search history.

(56) References Cited

U.S. PATENT DOCUMENTS

| 5,009,926 | A | 4/1991 | Fukuda |
| 6,221,788 | B1 | 4/2001 | Kobayashi et al. |
| 6,319,775 | B1 | 11/2001 | Halliyal et al. |
| 6,818,517 | B1 | 11/2004 | Maes |
| 6,821,868 | B2 | 11/2004 | Cheng et al. |
| 6,949,433 | B1 * | 9/2005 | Hidehiko et al. ............ 438/261 |
| 6,991,989 | B2 | 1/2006 | Lee et al. |
| 7,098,147 | B2 * | 8/2006 | Nansei et al. ............... 438/769 |
| 7,727,828 | B2 * | 6/2010 | Chua et al. .................. 438/197 |
| 2004/0097047 | A1 | 5/2004 | Natzle et al. |
| 2005/0136604 | A1 | 6/2005 | Al-Bayati et al. |
| 2007/0093013 | A1 | 4/2007 | Chua et al. |

OTHER PUBLICATIONS

Wang, Zhigang, et al., "Effect of Polysilicon Gate Type on the Flatland Voltage Shift for Ultrathin Oxide-Nitride Gate Stacks", IEEE Electron Device Letters, vol. 21, No. 4, Apr. 2000, pp. 170-172.
International Search Report and Written Opinion of the International Searching Authority mailed Oct. 1, 2007 for PCT Application No. PCT/US2006/039892.
International Search Report and Written Opinion of the International Searching Authority mailed Oct. 17, 2007 for PCT Application No. PCT/US07/68056.

* cited by examiner

*Primary Examiner*—Mary Wilczweski
*Assistant Examiner*—Toniae M Thomas
(74) *Attorney, Agent, or Firm*—Moser IP Law Group

(57) ABSTRACT

A method for fabricating a gate dielectric of a field effect transistor is disclosed herein. In one embodiment, the method includes the steps of removing a native oxide layer, forming an oxide layer, forming a gate dielectric layer over the oxide layer, oxidizing the gate dielectric layer, and annealing the layers and underlying thermal oxide/silicon interface. Optionally, the oxide layer may be nitridized prior to forming the gate dielectric layer. Optionally, the gate dielectric layer may be nitridized prior to oxidizing the gate dielectric layer. In one embodiment, at least portions of the method are performed using processing reactors arranged on a cluster tool.

36 Claims, 4 Drawing Sheets

METHOD FOR FABRICATING A GATE DIELECTRIC OF A FIELD EFFECT TRANSISTOR

BACKGROUND OF THE INVENTION

1. Field of the Invention

Embodiments of the present invention generally relate methods for fabricating devices on semiconductor substrates. More specifically, the present invention relates to a method for fabricating field effect transistors and, in particular, gate dielectrics of the field effect transistors.

2. Description of the Related Art

Integrated circuits may include more than one million micro-electronic field effect transistors (e.g., complementary metal-oxide-semiconductor (CMOS) field effect transistors) that are formed on a substrate and cooperate to perform various functions within the circuit. A CMOS transistor comprises a gate structure disposed over a channel region formed between source and drain regions of the transistor. The gate structure generally comprises a gate electrode and a gate dielectric. The gate electrode is disposed over the gate dielectric and, in operation, is used to control a flow of charge carriers (i.e., electric current) in the channel region beneath the gate dielectric.

The gate dielectric is typically formed from silicon nitride ($Si_3N_4$) or silicon oxynitride (SiON). To increase the speed of the transistor, a thickness of the gate dielectric in advanced integrated circuits is selected in a range of about 20-30 Angstroms or less. However, fabrication of gate structures having such ultra-thin gate dielectrics represents a challenging task. One specific problem is that present manufacturing techniques cause high leakage currents through the gate dielectric and decrease mobility of the charge carriers in the channel region due to diffusion of large amounts of nitrogen ($N_2$) into the silicon/gate dielectric interface of the transistors.

Therefore, there is a need in the art for an improved method for fabricating a gate dielectric of a field effect transistor.

SUMMARY OF THE INVENTION

The present invention generally relates to a method for fabricating a gate dielectric of a field effect transistor. The invention may be utilized in integrated circuit devices, such as microprocessors, application specific integrated circuits (ASICs), electronic memory devices, and the like.

In one embodiment, the method includes steps of removing a native oxide layer from a silicon substrate, forming an oxide layer on the substrate, forming a gate dielectric layer (e.g., silicon nitride ($Si_3N_4$), hafnium oxide ($HfO_2$), hafnium silicate ($HfSi_xO_y$, where x and y are integers), and the like) over the oxide layer, oxidizing the gate dielectric layer, and annealing the formed layers and interface between the thermal oxide layer and the substrate. Optionally, the oxide layer may be nitridized prior to forming the gate dielectric layer. Optionally, the gate dielectric layer may be nitridized prior to oxidizing the gate dielectric layer. In one embodiment, at least portions of the method may be performed using processing reactors of an integrated semiconductor substrate processing system (i.e., a cluster tool).

In another embodiment, a method for fabricating a gate dielectric of a field effect transistor upon a substrate, includes the steps of removing a native oxide layer from the substrate and placing the substrate in a nitrogen purged or vacuum environment; forming a thermal oxide layer on the silicon substrate; forming a gate dielectric layer on the thermal oxide layer; oxidizing at least a portion of the gate dielectric layer using an oxygen-containing plasma; and thermally annealing the substrate having the thermal oxide layer and the oxidized gate dielectric layer formed thereon.

In another aspect of the invention, an integrated semiconductor substrate processing system is disclosed for fabricating a gate dielectric of a field effect transistor. In one embodiment, the system includes at least one first reactor configured for forming a thermal oxide layer on a silicon substrate; at least one second reactor configured for depositing a gate dielectric layer on the thermal oxide layer; at least one third reactor configured for oxidizing the gate dielectric layer; at least one load-lock chamber; at least one substrate transfer chamber coupled to each of the reactors and load lock chambers; and a controller administering and monitoring operation of the processing system.

BRIEF DESCRIPTION OF THE DRAWINGS

The teachings of the present invention will become apparent by considering the following detailed description in conjunction with the accompanying drawings, in which.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention, which may admit to other equally effective embodiments.

DETAILED DESCRIPTION

The present invention is a method for fabricating a gate dielectric of field effect transistors having ultra-thin gate dielectrics (e.g., less than about 20-30 Angstroms). The invention may be used in fabrication of integrated semiconductor devices and circuits.

Figure 1:
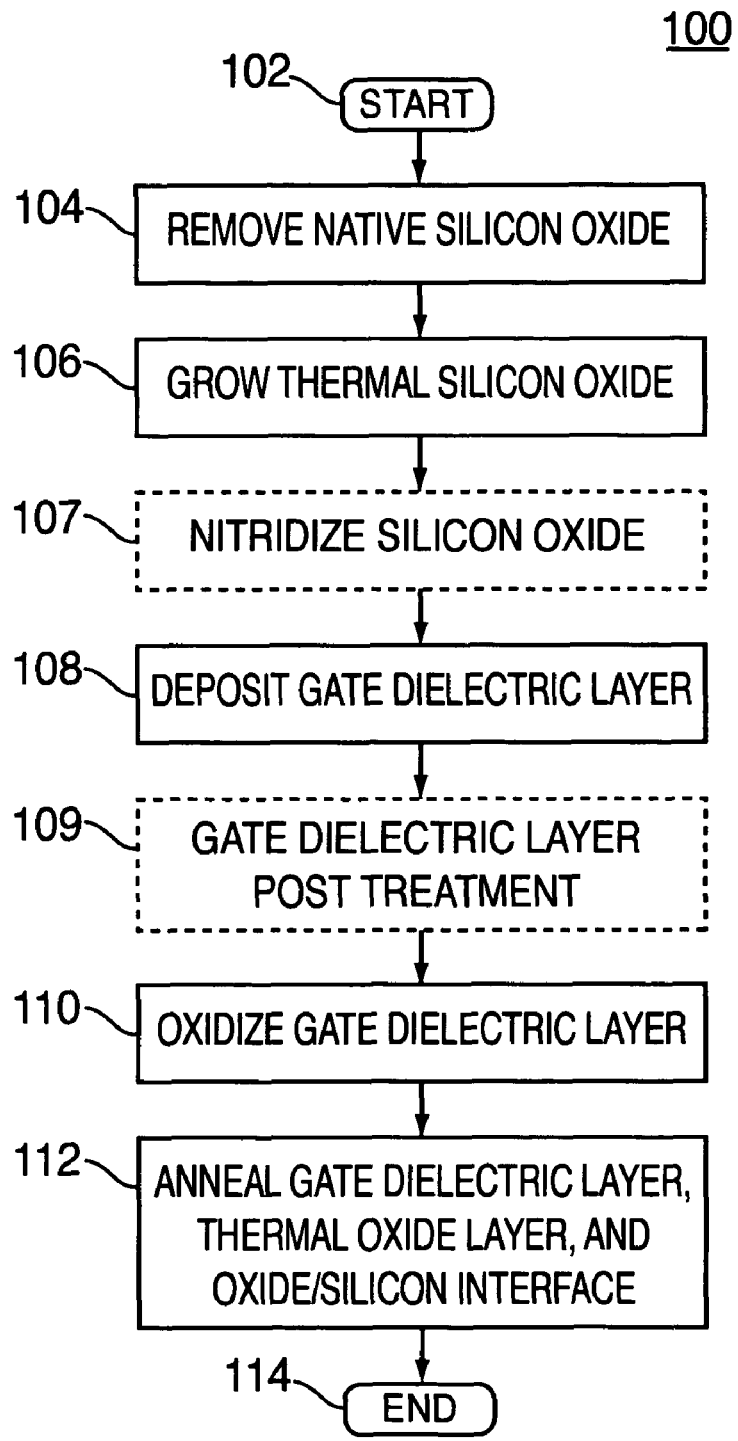
FIG. 1 depicts a flow diagram illustrating a method for fabricating a gate dielectric of a field effect transistor in accordance with one embodiment of the present invention.

FIG. 1 is a flow diagram illustrating a method 100 for fabricating a gate dielectric of a field effect transistor in accordance with one embodiment of the present invention. The method 100 includes processing steps performed upon a substrate during fabrication of the gate structure of an exemplary CMOS field effect transistor. In some embodiments, these processing steps are performed in the depicted order. In alternate embodiments, at least two of these steps may be performed contemporaneously or in a different order. Sub-steps and auxiliary procedures (e.g., substrate transfers between processing reactors, process control steps, and the like) are well known in the art and, as such, herein are omitted.

At least portions of the method 100 may be performed using processing reactors of an integrated semiconductor substrate processing system (i.e., a cluster tool). One such processing system is the CENTURA® integrated processing system, available from Applied Materials, Inc. of Santa Clara, Calif. A general description of a suitable processing system 300 is discussed below with reference to FIG. 3.

FIGS. 2A-2E, together, depict a series of schematic, cross-sectional views of a substrate upon which a gate structure is fabricated using the method of FIG. 1. The cross-sectional views in FIGS. 2A-2E relate to individual processing steps performed to fabricate the gate dielectric. The images in FIGS. 2A-2E are not depicted to scale and are simplified for illustrative purposes. To best understand the invention, the reader should refer simultaneously to FIGS. 1 and 2A-2E.

The method 100 starts at step 102 and proceeds to step 104.

Figure 2A:
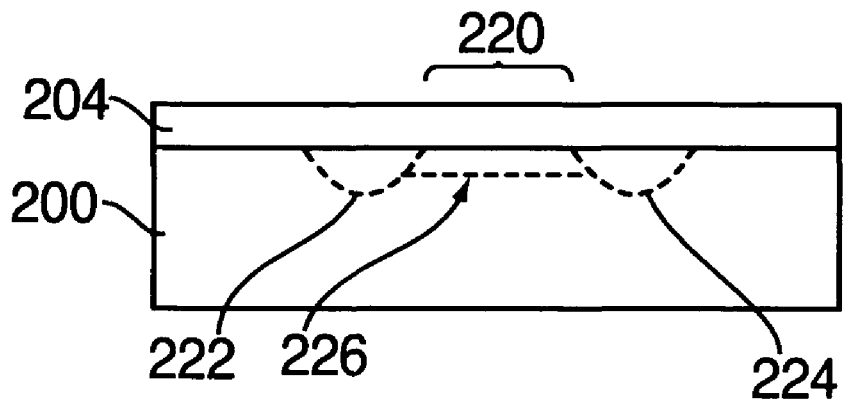
FIGS. 2A-2E, together, depict a series of schematic, cross-sectional views of a substrate where the gate structure is fabricated in accordance with the method of FIG. 1.

At step 104, a silicon (Si) substrate 200 is provided (e.g., 200 mm wafer, 300 mm wafer, and the like) and exposed to a solution for removing a native oxide ($SiO_2$) layer 204 from a surface of the substrate (FIG. 2A). Illustratively, the method 100 may be utilized to form a gate structure (not shown) of a transistor. The gate structure is generally disposed, for example, in region 220 above channel region 226 and source and drain regions 222 and 224 (depicted with broken lines) of the transistor. For graphical clarity, regions 220-226 are shown only in FIG. 2A.

In one embodiment, the layer 204 is removed using a solution comprising hydrogen fluoride (HF) and deionized (DI) water (i.e., a hydrofluoric acid solution). In one embodiment, the solution has between about 0.1 and 10% by weight of HF and a temperature of about 20-30 degrees Celsius (° C.). In another embodiment, the solution has about 0.5% of HF and a temperature of about 25° C. Step 104 can use a wet dip of the substrate 200 into the solution, followed by a rinse in de-ionized water, and may be performed in either a single wafer or batch baths, including ultra-sonically enhanced baths. Alternatively, step 104 may be performed using a single substrate wet cleaning reactor of the integrated processing system 300. In another embodiment, the layer 204 may be removed using an RCA clean method. Upon completion of step 102, the substrate 200 is placed in a vacuum load lock or nitrogen ($N_2$) purged environment.

Figure 2B:
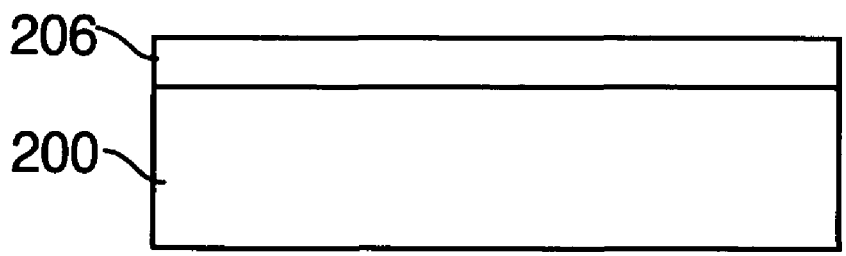

At step 106, a thermal oxide ($SiO_2$) layer 206 is grown on the substrate 200 (FIG. 2B). Generally, the layer 206 may have a thickness between about 2-40 Angstroms, preferably between about 2-10 Angstroms. In one embodiment, the layer 206 has a thickness between about 6-10 Angstroms. Step 106 can be performed using, e.g., a RADIANCE® rapid thermal processing (RTP) reactor, a decoupled plasma oxidation (DPO) reactor, or a plasma enhanced chemical vapor deposition (PECVD) reactor of the integrated processing system 300. The RADIANCE® reactor is available from Applied Materials, Inc., of Santa Clara, Calif.

In one embodiment, step 106 may be performed using an RTP reactor to grow the layer 206 by providing oxygen ($O_2$) at about 0.5-10 slm, while maintaining a substrate temperature of about 750-850° C., and a pressure in the reaction chamber of about 0.1-50 Torr. The duration of the process may be between about 5-30 seconds. In one embodiment, $O_2$ is provided at about 2 slm, while maintaining a temperature of about 800° C. and a pressure of about 2 Torr.

In another embodiment, the layer 206 may be grown in an RTP reactor by providing nitrous oxide ($N_2O$) at a rate of about 1-10 slm and hydrogen ($H_2$) at a rate of about 10-500 sccm (i.e., a $N_2O:H_2$ flow ratio ranging from about 2:1-1000:1) while maintaining a substrate temperature of about 700-850° C. Further, step 106 maintains a pressure in the reaction chamber at about 0.5-20 Torr. The duration of the process may be between about 5-60 seconds. One specific process recipe provides $N_2O$ at a rate of about 4.9 slm and $H_2$ at a rate of about 50 sccm (i.e., a $N_2O:H_2$ flow ratio of about 98:1) at a temperature of about 800° C.

In another embodiment, step 106 may be performed using a process chamber suitable for producing a low-energy plasma, such as a DPO chamber. The low energy of the plasma helps to control the reaction at the surface of the substrate and/or layer. For example, the plasma may be produced using a quasi-remote plasma source, an inductive plasma source, and/or an RLSA source, among other plasma sources. In alternate embodiments, sources of CW and/or pulsed microwave power, such as magnetron or RLSA microwave sources, may be used to form the layer 206.

In one embodiment, the layer 206 may be grown in a DPO reactor by exposing the substrate 200 to a plasma containing at least one of oxygen ($O_2$), nitric oxide (NO), nitrous oxide ($N_2O$), and the like. In addition, the plasma may optionally contain nitrogen ($N_2$) and/or an optional inert gas (e.g., argon (Ar), helium (He), and the like).

In one embodiment, the layer 206 may be formed using a DPO reactor by providing oxygen ($O_2$) at about 10-2000 sccm, a substrate pedestal temperature of about 20-500° C., and a pressure in the reaction chamber between about 5-1000 mTorr. The radio-frequency (RF) plasma is energized, e.g., at 13.56 MHz, using either a continuous wave (CW) or pulsed plasma power source of up to about 3-5 kW. During pulsing, the peak RF power may be in a range of about 10-3000 W, the frequency may be in a range of about 2-100 kHz, and the duty cycle may be in a range of about 2-50%. This process may be performed for about 1-180 sec. In one embodiment, $O_2$ is provided at about 200 sccm, and about 500 W of peak RF power is pulsed at about 10 kHz with a duty cycle of about 5% applied to an inductive plasma source, at a temperature of about 25° C. and a pressure of about 40-80 mTorr, for about 15-60 sec.

Figure 2C:
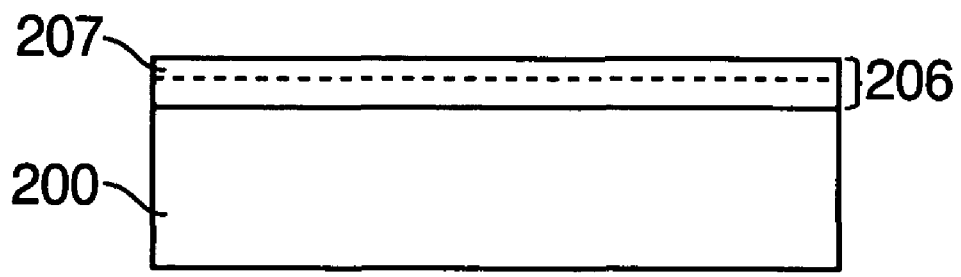

At optional step 107, the oxide layer 206 may be nitridized. The layer 206 may be nitridized, for example, in a plasma process or in a thermal process. Illustratively, step 107 forms a sub-layer 207 of nitridized material in an upper portion of the layer 206 (FIG. 2C). A thickness of the nitridized sub-layer 207 is typically formed in a range from about 0.5-5 Angstroms, preferably about 1-3 Angstroms.

In one embodiment, the layer 206 is exposed to a nitrogen-containing plasma. In one embodiment, the plasma contains nitrogen ($N_2$), and may optionally contain one or more optional inert gases (e.g., argon (Ar), helium (He), and the like). Step 107 can be performed using, e.g., a decoupled plasma nitridation (DPN) plasma reactor of the integrated processing system 300.

In one embodiment, the sub-layer 207 may be formed using a DPN reactor by providing nitrogen ($N_2$) at about 10-2000 sccm, a substrate pedestal temperature of about 20-500° C., and a pressure in the reaction chamber between about 5-1000 mTorr. The radio-frequency (RF) plasma is energized, e.g., at 13.56 MHz, using either a continuous wave (CW) or pulsed plasma power source of up to about 3-5 kW. During pulsing, peak RF power, frequency and a duty cycle are typically selected in the ranges from about 10-3000 W, about 2-100 kHz, and about 2-50%, respectively. This process may be performed for about 1-180 sec. In one embodiment, $N_2$ is provided at about 200 sccm, and about 1000 W of peak RF power is pulsed at about 10 kHz with a duty cycle of about 5% applied to an inductive plasma source, at a temperature of about 25° C. and a pressure of about 40-80 mTorr, for about 15-60 sec. The plasma may be produced using a quasi-remote plasma source, an inductive plasma source, and a radial line slotted antenna (RLSA) source, among other plasma sources. In alternate embodiments, sources of CW and/or pulsed microwave power may be used to form the sub-layer 207.

At optional step 107, the thermal oxide layer 206 can also be thermally nitrided by exposing it to an ammonia ($NH_3$) gas, or a mixture of $NH_3$ and $N_2$, or one or more inert gas such as helium, argon, and the like at high temperature in an RTP reactor to form the sub-layer 207 of nitridized material.

In one embodiment, the sub-layer 207 may be formed using an RTP reactor by providing ammonia ($NH_3$) gas at 5 to 1000 sccm while maintaining a substrate temperature of 700° C.-1000° C. and a pressure in the reactor chamber of about 0.1-10 Torr. The duration of the process may be between about 5-120 seconds. In one embodiment, $NH_3$ is provided at 100 sccm while maintaining a temperature of about 800° C. and a pressure of 0.3 Torr for a time of 15 seconds. Optionally, batch furnaces may be used to form the sub-layer 207.

Figure 2D:
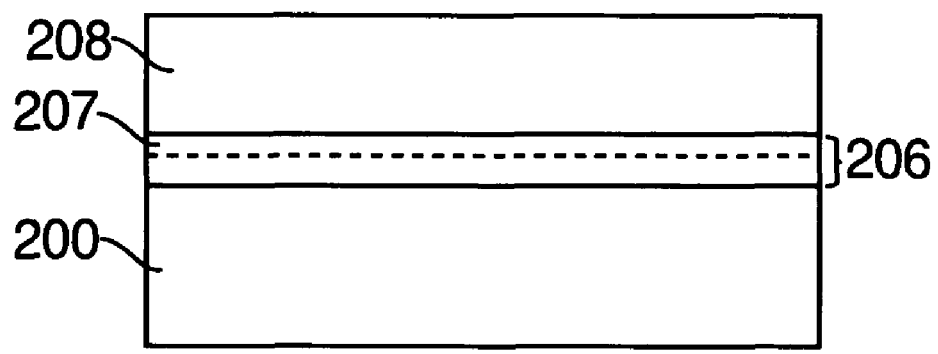

At step 108, a gate dielectric layer 208 is deposited over the thermal oxide layer 206 (FIG. 2D). The layer 208 may be formed from silicon nitride ($Si_3N_4$) to a thickness of about 2-20 Angstroms or a high-k material, such as hafnium oxide ($HfO_2$), hafnium silicate (such as $Hf_xSi_yO$, where x and y are integers), and the like, or a combination thereof, to a thickness of about 10-60 Angstroms. Step 108 can be performed using, e.g., a chemical vapor deposition (CVD) reactor or a atomic layer deposition (ALD) reactor of the integrated processing system 300, such as an CVD reactor or an ALD reactor. One suitable CVD reactor is an XGen CVD reactor, available from Applied Materials, Inc.

In one embodiment, using a CVD reactor, the gate dielectric layer 208 may comprise silicon nitride ($Si_3N_4$) and may be formed by providing ammonia ($NH_3$) at about 100-1000 sccm, silane ($SiH_4$) at about 1-100 sccm (i.e., a $NH_3$:$SiH_4$ flow ratio ranging from 1:1 to 1000:1), and nitrogen ($N_2$) at about 10-1000 sccm, while maintaining a substrate pedestal temperature of about 400-750° C., and a pressure in the reaction chamber of between about 0.1-50 Torr. This process may be performed for about 30-180 sec. In one embodiment, $NH_3$ is provided at about 500 sccm, $SiH_4$ at about 10 sccm (i.e., a $NH_3$:$SiH_4$ flow ratio of about 50:1), and $N_2$ at about 25 sccm, while maintaining a temperature of about 600° C. and pressure of about 5 Torr in the chamber. Other silicon source gas or chemical can be used in place of silane ($SiH_4$) such as disilane ($Si_2H_6$), dichlorosilane (DCS), trichlorosilane (TCS), tetrachlorosilane (TCS) or hexachlorodisilane (HCD).

In another embodiment, the gate dielectric layer 208 may comprise hafnium oxide or hafnium silicate and may be deposited using a CVD or an ALD process. The hafnium oxide or hafnium silicate gate dielectric layer 208 may be formed using metal-organic or inorganic precursors of hafnium and silicon with an oxidizer comprising at least one of ozone, water, or remote plasma oxygen radicals.

At optional step 109, the gate dielectric layer 208 may further be nitrided with a similar processes as used in the formation of sub-layer 207. The optional treatment of the gate dielectric layer 208 after step 108 introduces additional nitrogen atoms into the gate dielectric layer 208, thereby providing greater leakage current reduction through the gate dielectric layer 208. The nitridization of the gate dielectric layer 208 typically introduces nitrogen atoms into the gate dielectric layer 208 to a depth in a range of about 0.5-5 Angstroms, preferably about 1-3 Angstroms.

Figure 2E:
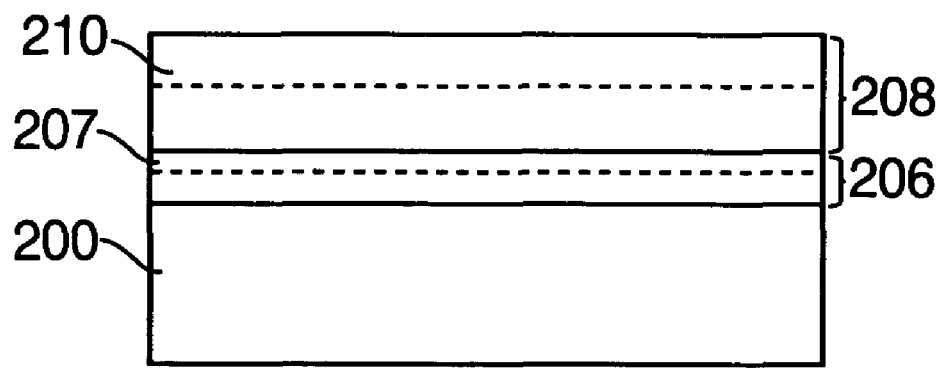

At step 110, the gate dielectric layer 208 is oxidized by exposure to an oxygen-containing plasma. Illustratively, step 110 forms a sub-layer 210 of oxidized material in an upper portion of the layer 208 (FIG. 2E). A thickness of the oxidized sub-layer 210 is typically selected in a range from about 0.2-10 Angstroms, preferably about 0.5-5 Angstroms.

In one embodiment, the plasma contains at least one of oxygen ($O_2$), nitric oxide (NO), nitrous oxide ($N_2O$), and the like, as well as may contain optional nitrogen ($N_2$) and/or an optional inert gas (e.g., argon (Ar), helium (He), and the like). Step 110 may be performed using a process chamber suitable for producing a low-energy plasma. The low energy of the plasma helps to control the reaction at the surface of the substrate and/or layer. For example, the plasma may be produced using a quasi-remote plasma source, an inductive plasma source, and/or an RLSA source, among other plasma sources. In alternate embodiments, sources of CW and/or pulsed microwave power, such as magnetron or RLSA microwave sources, may be used to form the sub-layer 210. In one embodiment, step 110 may be performed using, e.g., the DPN plasma reactor of the integrated processing system 300.

The sub-layer 210 may be formed by providing oxygen ($O_2$) at about 10-2000 sccm. The oxygen may optionally be mixed with $N_2$ and/or He and/or Ar. The substrate pedestal temperature is maintained at about 20-500° C., and the pressure in the reaction chamber may be between about 5-1000 mTorr. The radio-frequency (RF) plasma is energized, e.g., at about 13.56 MHz, using either a continuous wave (CW) or pulsed plasma power source of up to about 3-5 kW. During pulsing, peak RF power, frequency and a duty cycle are typically selected in the ranges from about 10-3000 W, about 2-100 kHz, and about 2-50%, respectively. The oxidation process may be performed for about 1-180 seconds. In one embodiment, $O_2$ is provided at about 200 sccm, with about 1000 W of peak RF power pulsed at about 10 kHz with a duty cycle of about 5% applied to an inductive plasma source, at a temperature of about 25° C. and a pressure of about 40 mTorr for about 30 seconds.

At step 112, the gate dielectric layer 208 and oxide/silicon interface between the layer 206 and substrate 200 are annealed. Step 112 improves the leakage current reduction of the layers 206 and 210 and increases the mobility of charge carriers in the channel region 226 (shown in FIG. 2A), as well as improves reliability of the oxide/silicon interface. Step 112 can be performed using a suitable thermal annealing chamber, such as an RTP (e.g., a RADIANCE® or RTP XE+) reactor of the integrated processing system 300, or either a single substrate or batch furnace.

In one embodiment, the annealing process of step 112 may performed by providing at least one of oxygen ($O_2$) at about 2-5000 sccm and nitric oxide (NO) at about 100-5000 sccm, either gas optionally mixed with nitrogen ($N_2$), while maintaining a substrate surface temperature of about 800-1100° C., and a pressure in the reaction chamber of about 0.1-50 Torr. The process may be performed for about 5-180 seconds. In one embodiment, $O_2$ is provided at about 500 sccm while maintaining the chamber at a temperature of about 1000° C. and a pressure of about 0.1 Torr, for a duration of about 15 seconds. In another embodiment, NO is provided at about 500 sccm, while maintaining the chamber at a temperature of about 1000° C. and a pressure of about 0.5 Torr, for duration of about 15 seconds.

Upon completion of step 112, at step 114, method 100 ends. In the manufacture of integrated circuits, the method 100 advantageously forms ultra-thin gate dielectrics representing high resistivity paths for leakage currents and facilitates high mobility of charge carriers in the channel regions of the field effect transistors.

Figure 3:
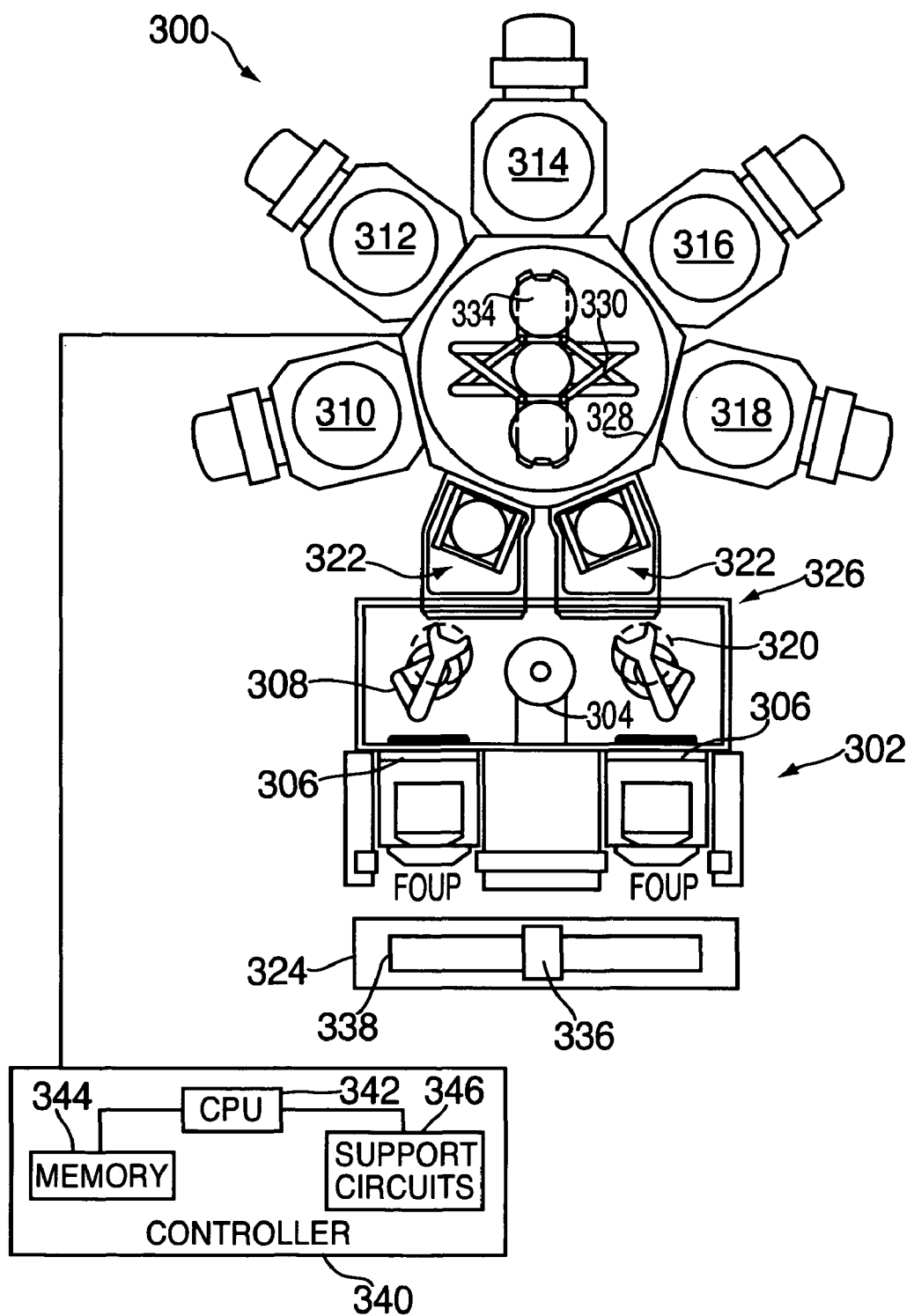
FIG. 3 depicts a schematic diagram of an exemplary integrated semiconductor substrate processing system of the kind that may be used to practice portions of the invention.

FIG. 3 depicts a schematic diagram of the exemplary CENTURA® integrated semiconductor substrate processing system (e.g., cluster tool) 300 of the kind that may be used to practice portions of the method 100 of FIG. 1. The particular embodiment of the system 300 is illustrative only and should not be used to limit the scope of the invention. It is contemplated that the method 100 may be practiced using other semiconductor substrate processing systems and/or processing reactors.

The integrated processing, system 300 generally includes vacuum load-lock chambers 322, a vacuum-tight plenum 328 having a robot 330 supplied with a substrate receptacle 334, process modules 310, 312, 314, 316, and 318 coupled to the plenum 328, an input/output module 302, an optional metrology module 326, and a system controller 340. The load-lock chambers 322 are used as docking stations for substrate cassettes and protect the plenum 328 from atmospheric contaminants. The robot 330 transfers the substrates between the load lock chambers and process modules. The depicted embodiment of the robot 330 is exemplary and should not limit the scope of the invention. The input/output module 302 comprises at least one front opening unified pod (FOUP) 306 (two FOUPs 306 are depicted) facilitating an exchange of the substrate cassettes between a factory interface 324, the metrology module 326, and the load-lock chambers 322.

The system controller 340 generally comprises a central processing unit (CPU) 342, a memory 344, and support circuits 346 and is coupled to and controls modules and apparatus of the integrated processing system 300, as well as enables data collection and feedback from the respective modules to optimize performance of the system 300. In operation, the controller 340 uses a direct control of modules and apparatus of the system 300 or, alternatively, administers computers (or controllers) associated with these modules and apparatuses.

At least one of the processing modules 310, 312, 314, 316, and 318 may be an RTP reactor (e.g., a RADIANCE® reactor), a PECVD reactor, a CVD reactor (e.g., an XGen reactor), an ALD reactor, a DPN reactor, and/or other reactor suitable for performing the processes described above on reference to FIG. 1. One example of a possible configuration of the system 300 for performing processes in accordance with the present invention includes two load-lock chambers 322, two RTP modules 310 and 312, an ALD module 314, a CVD module 316, a DPN module 318, a metrology module 326 comprising a measuring tool 304 and robots 308 and 320, and the input/output module 302 comprising two FOUPs 306. It is contemplated that other configurations of the system 300 may also be utilized to practice the invention described herein.

The invention may be practiced using other processes where parameters may be adjusted to achieve acceptable characteristics by those skilled in the art by utilizing the teachings disclosed herein without departing from the spirit of the invention. Although the forgoing discussion referred to fabrication of a field effect transistor, fabrication of the other devices and structures used in integrated circuits can also benefit from the invention.

While the foregoing is directed to embodiments of the present invention, other and further embodiments of the invention may be devised without departing from the basic scope thereof, and the scope thereof is determined by the claims that follow.

The invention claimed is:

1. A method for fabricating a gate dielectric of a field effect transistor, comprising:
   (a) providing a silicon substrate;
   (b) removing a native oxide layer from the silicon substrate;
   (c) forming an oxide layer on the silicon substrate, wherein the oxide layer is formed in a plasma process comprising exposing the oxide layer to a plasma comprising at least one of oxygen, nitric oxide, or nitrous oxide;
   (d) forming a gate dielectric layer on the oxide layer;
   (e) oxidizing at least a portion of the gate dielectric layer using an oxygen-containing plasma; and
   (f) annealing the gate dielectric layer, the oxide layer, and interface between the oxide layer and the silicon substrate;
   wherein the silicon substrate is maintained in a vacuum environment between steps (c) through (e).

2. The method of claim 1, further comprising:
   maintaining the silicon substrate in a vacuum environment from step (c) through step (f).

3. The method of claim 1, wherein step (b) further comprises:
   exposing the substrate to a solution comprising hydrogen fluoride and deionized water.

4. The method of claim 1, wherein step (c) further comprises:
   forming the oxide layer to a thickness between about 2-10 Angstroms.

5. The method of claim 1, wherein the plasma further comprises at least one of nitrogen, argon, or helium.

6. The method of claim 1, wherein step (c) further comprises:
   nitridizing the oxide layer.

7. The method of claim 6, wherein the step of nitridizing further comprises:
   creating a sub-layer of nitridized material in the oxide layer having a thickness between about 0.5-5 Angstroms.

8. The method of claim 6, wherein the step of nitridizing further comprises:
   creating a sub-layer of nitridized material in the oxide layer having a thickness between about 1-3 Angstroms.

9. The method of claim 6, wherein the nitridizing step further comprises:
   exposing the oxide layer to nitrogen-containing plasma.

10. The method of claim 9, wherein the nitrogen-containing plasma further comprises at least one of argon or helium.

11. The method of claim 6, wherein the nitridizing step further comprises:
    thermally nitridizing the oxide layer in an atmosphere comprising ammonia.

12. The method of claim 11, wherein the atmosphere further comprises at least one of nitrogen, helium, or argon.

13. The method of claim 1, wherein step (d) further comprises:
    forming the gate dielectric layer from at least one of silicon nitride, hafnium oxide, and hafnium silicate.

14. The method of claim 13, wherein step (d) further comprises:
    forming the gate dielectric layer from at least one of hafnium oxide or hafnium silicate to a thickness of about 10-60 Angstroms.

15. The method of claim 13, further comprising:
    forming the gate dielectric layer from silicon nitride to a thickness of about 2-10 Angstroms.

16. The method of claim 1, wherein step (d) further comprises:
    nitridizing the gate dielectric layer.

17. The method of claim 16, wherein the nitridizing step further comprises:
    exposing the gate dielectric layer to nitrogen-containing plasma.

18. The method of claim 17, wherein the nitrogen-containing plasma further comprises at least one of argon or helium.

19. The method of claim 16, wherein the nitridizing step further comprises:
    thermally nitridizing the gate dielectric layer in an atmosphere comprising ammonia.

20. The method of claim 19, wherein the atmosphere further comprises at least one of nitrogen, helium, or argon.

21. The method of claim 1, wherein step (e) further comprises:
    using a plasma of an oxygen-containing gas.

22. The method of claim 21, wherein the oxygen-containing gas comprises at least one of oxygen, nitric oxide, and nitrous oxide.

23. The method of claim 21, wherein the plasma further comprises at least one of nitrogen, helium, and argon.

24. The method of claim 1, wherein step (e) further comprises forming a plasma using a low energy plasma source.

25. The method of claim 1, wherein step (f) further comprises:
thermally annealing the substrate in a rapid thermal processing chamber or a furnace.

26. A method for fabricating a gate dielectric of a field effect transistor, comprising:
(a) providing a silicon substrate;
(b) removing a native oxide layer from the silicon substrate;
(c) forming an oxide layer on the silicon substrate;
(d) forming a gate dielectric layer on the oxide layer;
(e) oxidizing at least a portion of the gate dielectric layer using an oxygen-containing plasma, wherein oxidizing at least a portion of the gate dielectric layer further comprises forming in an upper portion of the gate dielectric layer an oxidized sub-layer having a thickness of about 0.2-10 Angstroms; and
(f) annealing the gate dielectric layer, the oxide layer, and interface between the oxide layer and the silicon substrate;
wherein the silicon substrate is maintained in a vacuum environment between steps (c) through (e).

27. The method of claim 26, wherein step (e) further comprises:
forming the oxidized sub-layer to a thickness of about 0.5-5 Angstroms.

28. A method for fabricating a gate dielectric of a field effect transistor upon a substrate, comprising:
(a) removing a native oxide layer from the substrate and placing the substrate in a nitrogen purged or vacuum environment;
(b) forming a thermal oxide layer on the substrate;
(c) forming a gate dielectric layer on the thermal oxide layer;
(d) oxidizing at least a portion of the gate dielectric layer using an oxygen-containing plasma;
(e) thermally annealing the substrate having the thermal oxide layer and the oxidized gate dielectric layer formed thereon; and
(f) nitridizing the thermal oxide layer prior to step (c).

29. A method for fabricating a gate dielectric of a field effect transistor upon a substrate, comprising:
(a) removing a native oxide layer from the substrate and placing the substrate in a nitrogen purged or vacuum environment;
(b) forming a thermal oxide layer on the substrate;
(c) forming a gate dielectric layer on the thermal oxide layer;
(d) oxidizing at least a portion of the gate dielectric layer using an oxygen-containing plasma;
(e) thermally annealing the substrate having the thermal oxide layer and the oxidized gate dielectric layer formed thereon; and
(f) nitridizing the gate dielectric layer prior to step (d).

30. A method for fabricating a gate dielectric of a field effect transistor, comprising:
(a) providing a silicon substrate;
(b) removing a native oxide layer from the silicon substrate;
(c) forming an oxide layer on the silicon substrate;
(d) forming a gate dielectric layer on the oxide layer;
(e) oxidizing at least a portion of the gate dielectric layer using an oxygen-containing plasma;
(f) annealing the gate dielectric layer, the oxide layer, and interface between the oxide layer and the silicon substrate; and
(g) nitridizing at least one of the oxide layer formed in step (c) or the gate dielectric layer formed in step (d).

31. The method of claim 30, wherein the step of nitridizing further comprises:
creating a sub-layer of nitridized material in at least one of the oxide layer or the gate dielectric layer having a thickness between about 0.5-5 Angstroms.

32. The method of claim 30, wherein the step of nitridizing further comprises:
creating a sub-layer of nitridized material in at least one of the oxide layer or the gate dielectric layer having a thickness between about 1-3 Angstroms.

33. The method of claim 30, wherein the nitridizing step further comprises:
exposing at least one of the oxide layer or the gate dielectric layer to a nitrogen-containing plasma.

34. The method of claim 33, wherein the nitrogen-containing plasma further comprises at least one of argon or helium.

35. The method of claim 30, wherein the nitridizing step further comprises:
thermally nitridizing at least one of the oxide layer or the gate dielectric layer in an atmosphere comprising ammonia.

36. The method of claim 35, wherein the atmosphere further comprises at least one of nitrogen, helium, or argon.

* * * * *